United States Patent [19]

Borman et al.

[11] Patent Number: 5,437,026

[45] Date of Patent: Jul. 25, 1995

[54] REMOVING UNCOMMITTED CHANGES MADE TO STORED DATA BY A DATABASE MANAGEMENT SYSTEM

[75] Inventors: Samuel D. Borman; Arthur J. Tyrrell, both of Hampshire, England

[73] Assignee: International Business Machines Corporation, Armonk, N.Y.

[21] Appl. No.: 83,860

[22] Filed: Jun. 28, 1993

Related U.S. Application Data

[63] Continuation of Ser. No. 535,088, Jun. 8, 1990, abandoned.

[30] Foreign Application Priority Data

Jun. 13, 1989 [EP] European Pat. Off. .......... 89305987

[51] Int. Cl.⁶ ...................... G06F 11/08; G06F 11/30
[52] U.S. Cl. ................................... 395/600; 395/575; 364/222.82; 364/267; 364/282.1
[58] Field of Search ................. 395/650, 700, 600, 575

[56] References Cited

U.S. PATENT DOCUMENTS

| | | | |
|---|---|---|---|
| 4,751,702 | 6/1988 | Beier et al. ........................... | 395/600 |
| 4,868,744 | 9/1989 | Reinsch et al. ...................... | 395/575 |
| 4,878,167 | 10/1989 | Kapulka et al. ..................... | 395/575 |
| 4,888,681 | 12/1989 | Barnes et al. ........................ | 395/600 |
| 4,945,474 | 7/1990 | Elliott et al. ......................... | 395/600 |
| 5,043,866 | 8/1991 | Myre et al. ........................... | 395/600 |
| 5,077,658 | 12/1991 | Bendert et al. ...................... | 395/600 |
| 5,123,104 | 6/1992 | Levine et al. ........................ | 395/600 |
| 5,155,678 | 10/1992 | Fukumoto et al. .................. | 395/425 |

FOREIGN PATENT DOCUMENTS 0098928 5/1983 European Pat. Off. .

OTHER PUBLICATIONS

A. Reuter, "Minimizing the I/O-operations for undo-logging in database systems", Proc. of the Fifth International Conference on Very Large Data Bases, Oct. 3-5, 1979, pp. 164-172.

R. A. Crus, "Data recovery in IBM Database 2", IBM Systems Journal vol. 23, No. 2, 1984, pp. 178-188.

*Primary Examiner*—Kevin A. Kriess
*Assistant Examiner*—John Q. Chavis
*Attorney, Agent, or Firm*—Pryor A. Garnett; Esther E. Klein

[57] ABSTRACT

A method of removing uncommitted changes made to stored data by a database management system, wherein the system stores a duplicate copy of data prior to effecting changes to the original copy, and upon failure of the system or of a transaction or transactions effecting the changes, replaces the copy containing uncommitted changes by the duplicate copy. If the system fails to replace the original copy (as in the case of a backout failure), the system prevents subsequent attempts by the system to further change the data until the uncommitted changes have been removed by a process of backout failure processing. Backout failure log records are created to track whether the system completed its backout failure processing (END), which transactions had failed backout (SUBSEQUENT), and which transaction was the first to have a backout failure (FIRST). A batch backout utility program uses the set of backout failure log records to bracket the duration of the backout failure for a particular file.

7 Claims, 3 Drawing Sheets

```
                  200
201   Read system log backwards
202   IF backout failure log record THEN
203      IF for a database that the user has asked to be backed
            out THEN
204         IF first backout failure log record read backwards
               for this database THEN
205            IF backout failure log record END THEN
206               Set flag to remember backout failure log
                     record END read
207            ELSE
208               ERROR.  /*The system did not complete     */
                         /*backout.  Backout for this       */
                         /*database is the responsibility   */
                         /*of the system operator.          */
209            END IF
            ELSE
210            IF backout failure log record FIRST has been
                  read for this database THEN
211               Ignore this backout failure log record.
                              /*A set of backout failure log   */
                              /*records has been read for this */
                              /*database, and this backout     */
                              /*failure log record is for a    */
                              /*previous backout failure.      */
212            ELSE
213               Record the transaction identifier in this
                     backout failure log record against the
                     database
214               IF backout failure log record FIRST THEN
215                  Record this against data base
216               END IF
217            END IF
218         END IF
219      ELSE
220         Ignore
221      END IF
222   END IF

BATCH BACKOUT UTILITY - PART A
```

```
101   IF this data base has already had a backout failure THEN
102       Write a backout failure log record SUBSEQUENT
103   ELSE
104       Write a backout failure log record FIRST
105       Record that this data base has had a backout failure
106       Ensure subsequent attempts to update the data base are
              disallowed
107   END IF
108   WHEN all tasks using this data base have completed
109       Close the data base
110       Write a backout failure log record END
111   END
```

BACKOUT FAILURE CONTROL

201  Read system log backwards
202  IF backout failure log record THEN
203      IF for a database that the user has asked to be backed
         out THEN
204          IF first backout failure log record read backwards
             for this database THEN
205              IF backout failure log record END THEN
206                  Set flag to remember backout failure log
                     record END read
207              ELSE
208                  ERROR.   /*The system did not complete    */
                              /*backout.  Backout for this     */
                              /*database is the responsibility */
                              /*of the system operator.        */
209              END IF
             ELSE
210              IF backout failure log record FIRST has been
                 read for this database THEN
211                  Ignore this backout failure log record.
                              /*A set of backout failure log   */
                              /*records has been read for this */
                              /*database, and this backout     */
                              /*failure log record is for a    */
                              /*previous backout failure.      */
212              ELSE
213                  Record the transaction identifier in this
                     backout failure log record against the
                     database
214                  IF backout failure log record FIRST THEN
215                      Record this against data base
216                  END IF
217              END IF
218          END IF
219      ELSE
220          Ignore
221      END IF
222  END IF
```

BATCH BACKOUT UTILITY — PART A

FIG. 2A

```
223  IF before-image THEN
224      IF before-image for a database that the user has asked
         to be backed out THEN
225          IF transaction identifier of before-image has been
             found in a backout failure log record THEN
226              Apply the before-image
227          ELSE
228              Ignore.  /*As there has not been a backout */
                          /*failure log record for this     */
                          /*transaction identifier, this    */
                          /*task did NOT fail backout.      */
229          END IF
230      ELSE
231          Ignore
232      END IF
233  END IF 234  IF first log record for a transaction THEN
235      IF this transaction identifier is recorded against any
         databases THEN
236          Remove this record
237          IF there are any date bases that had the transaction
             identifier AND a backout failure log record FIRST
             has been read for the database THEN
238              Remove the database from the list of databases
                 to be backed out
239              IF there are no databases to be backed out left
                 THEN
240                  End of job
241              END IF
242          END IF
243      END IF
244  END IF
```

BATCH BACKOUT UTILITY — PART B

FIG. 2B

REMOVING UNCOMMITTED CHANGES MADE TO STORED DATA BY A DATABASE MANAGEMENT SYSTEM

This is a continuation of application Ser. No. 07/535,088 filed Jun. 8, 1990, now abandoned.

BACKGROUND OF THE INVENTION

1. Technical Field

The present invention relates to a method of removing uncommitted changes made to stored data by a database management system such as, for example, a transaction processing system, and in particular to a transaction processing system in which a copy is made of stored data prior to making changes to that stored data; failure of the system during the processing of a transaction, i.e. making changes to stored data, is dealt with such that integrity of the data is not lost.

2. Description of the Prior Art

A transaction in an on-line transaction processing system, such as for example the IBM (IBM is a registered trademark of International Business Machines Corporation) Customer Information Control System, CICS, is a change or a number of changes made to data held in storage in the transaction processing system. In order to ensure integrity of data a transaction must be "all-or-nothing", meaning that either the complete change to the data is made or none of the changes must be made. Usually the change or changes making up the transaction are made sequentially and upon completion of all the changes a signal is sent to the system to instruct the system to "commit" the changes.

Should the system fail or a transaction terminate abnormally before all changes making up the transaction have been made and committed, the system must remove or "backout" all those changes which have not been committed by the system in order to preserve data integrity. It does this by replacing the changed data with a copy of the original data (a "before-image") which it saved just before the transaction performed its changes, thus re-instating the original data, and removing the unwanted changes.

It is possible for backout processing to fail during the course of replacement of the uncommitted changes (i.e. a backout failure occurs), for example because the storage device on which the data containing the uncommitted changes has malfunctioned. Failure of the system to replace uncommitted changes to the data has previously meant that, in order to maintain integrity of the data, action was required of an operator to prevent further changes being made to the data. In previous transaction processing systems this was done by shutting down the whole system, correcting the problem, and then restarting the system as an "emergency restart"; the operator either had to shut down the system leading to disruption of transaction processing, or accept that some data contained uncommitted changes. Shutdown of the system may have an effect on any "warm standby" systems, where another transaction processing system is standing-by ready to take over processing should the main system fail in any way. The standby system performs an emergency restart when it takes over, and any backout performed during this emergency restart will immediately fail again.

SUMMARY OF THE INVENTION

The present invention provides a transaction processing system able to continue operating while isolating that part of the data, generally referred to as a file, containing uncommitted changes until it has been replaced by the original data or before image.

The present invention also provides a method which improves earlier backout methods by closing only the file on which the backout failure has occurred, and running a program to retry the backout.

Accordingly the present invention provides a method of removing uncommitted changes made to stored data by a database management system. The system stores a duplicate copy of data prior to effecting changes to the original copy, and upon failure of the system or a transaction or transactions effecting the changes, replaces the copy containing uncommitted changes by the duplicate copy. In the case of failure of the system to replace the original copy (i.e., in the case of a backout failure), the system prevents subsequent attempts by the system to further change the data until the uncommitted changes have been removed by a process of backout failure processing. Preferably, in the case of failure of the system to replace the original copy, the system displays notice of the failure and prevents subsequent attempts by the system to further change the data until the uncommitted changes have been removed. Suitably the system displays notice of failure to an operator using a visual display unit.

Suitably, the database management system is a transaction processing system that does before-image logging.

In a preferred embodiment of the present invention, removal of unwanted data updates because they contain uncommitted changes is effected using a batch backout utility program.

Other features and advantages of this invention will become apparent from the following detailed description of the presently preferred embodiment of the invention, taken in conjunction with the accompanying drawings.

BRIEF DESCRIPTION OF THE DRAWINGS

FIG. 1 shows a pseudocode implementation of backout failure logic according the preferred embodiment.

FIGS. 2A–2B show a pseudocode implementation of a batch backout utility using the backout failure log records of FIG. 1.

DESCRIPTION OF THE PREFERRED EMBODIMENT

A batch backout utility 200 is a program which can be run when a transaction processing system such as CICS encounters a problem which prevents it from removing the unwanted data updates that may be left behind by a transaction which does not complete its processing normally. The batch backout utility 200 backs out the unwanted update by selecting the relevant before-image from the system log or a copy thereof and using it to replace the update. The system log is a sequential dataset on which the system records various data for use in system restart, performance monitoring, auditing, debugging, etc. (i.e. the system keeps a "log" of its actions on this dataset). Before-images are included in this data.

The batch backout utility 200 reads the system log and must decide which before-images to reinstate. This may not be a simple task. There may be many transactions executing concurrently on the system, and each transaction may be updating several files. A backout failure on one file can have a domino effect, causing a string of subsequent backout failures on the same file or others. Also, if the problem that caused the backout failure concerned a whole storage element such as, for example, a magnetic disk, then many files on that magnetic disk could be affected and many backout failures could occur in rapid succession.

When a backout failure occurs in a transaction processing system, data with uncommitted changes i.e. any unwanted data update must be isolated so that other transactions cannot access it. In one embodiment of the present invention this is done by closing the file in which the data containing the uncommitted data is stored. However, it may not be possible to close the file immediately because other transactions may be in the process of updating it, and it is preferable to allow these transactions to run to completion if possible. Of course, some of these transactions may not be able to complete (possibly because of the same problem) and they may terminate abnormally, and backout of their updates may fail. Thus subsequent backout failures on the same file could occur between the first backout failure and the point when the file can be closed and the unwanted updates isolated.

Additional complexity can arise if the whole system itself fails during a backout failure, for instance because of a power cut, system error, operating system fault etc. If a transaction processing system such as, for example the CICS system fails (i.e. terminates abnormally) then it is restarted in emergency restart mode. In this mode, the system tries to get things back to the state they were in when it failed, before continuing. The system can work out which transactions were in progress (i.e. executing) at the time of failure, and will treat these transactions as having terminated abnormally, and it will attempt to backout their uncommitted updates. Obviously these attempts could end in yet more backout failures.

In the CICS system and other related systems, several files may actually represent the same collection of data (i.e., dataset) but be accessed via different paths, and so two backout failures for different files may be for the same dataset. All this complexity is reflected in the records that appear on the system log, and so the batch backout utility 200 may have a very complex task, trying to unravel this interlaced stream of records and keep track of them. Preferably the batch backout utility should be able to perform backout for multiple files in one run, to backout an update as soon as it has found the relevant before-image (so that it does not have to store the before-image), and to do this with only one scan through the system log. Also, the batch backout utility must be able to decide whether it should backout a particular update, or if it should leave it to emergency restart. Likewise, emergency restart must be able to decide which backouts to attempt, and which to leave to the batch backout utility.

The present invention provides a set of system log records to, in effect, bracket the duration (i.e., mark the beginning and end) of a backout failure for a particular file. Using these records, the batch backout utility can track:

whether the system completed its backout failure processing (i.e., if the system failed before the backout failure processing was completed, then the batch backout utility should not attempt backout, because the emergency restart of the system will retry it);

which transactions had failed backout against which files (and therefore which changes to backout);

which transaction was the first to have a backout failure (and so when to stop looking for any others).

Three types of backout failure log record of the invention show the start, middle and end of each backout failure process, and, although the processes themselves may be occurring concurrently, and hence the log records may appear interlaced on the system log, it is relatively easy for the batch backout utility 200 to keep track of each individual backout failure process.

According to the preferred embodiment of the invention, the transaction processing system contains backout failed log records. The backout failed log records contain the information that the batch backout utility will need to calculate if it is safe to attempt backout, where to start, where to stop and which original records it must reapply in order to back out uncommitted changes. Fields in the backout failure log records include: a FIRST flag, (which is set if it is the first backout failure log record for a given dataset); a dataset name; and a transaction identifier.

There are three different types of backout failure log record:

(i) backout failure log record FIRST, indicating which task was the first to have a backout failure for a given dataset;

(ii) backout failure log record SUBSEQUENT, indicating which tasks had backout failures subsequently for a given dataset; and (iii) backout failure log record END, indicating that backout failure has completed for a given dataset.

FIGS. 1 and 2A–2B show how backout failure log records are created and used. The term "database" is used to represent the entity to be backed out.

In a preferred embodiment of the present invention, whenever a backout failure occurs, the system calls a user-written program to allow the user to handle the situation if possible, but would change transaction processing on return from the call to the user to execute "backout failure control" code 100 as shown in FIG. 1, rather than just ignoring the backout failure. The backout failure logic as shown in the pseudocode of FIG. 1 is called whenever the backout process fails to apply the before-image to the database.

Whenever a backout failure occurs, a "backout failed" flag in a file status control block is examined (line 101). If it is not set (line 103), then this backout failure must be the first for this file, and the file is put into a "backout failed" status, by switching the flag on (line 105). The system will check this status whenever a transaction requests access to the file. If it is found to be set, then the system will deny access to the file. The file is also put into a "closing" state. This means that the file will be closed as soon as the last transaction that has been accessing the file is finished with it (line 106) (There may be more than one transaction at a time updating the file). A "backout failed" record is written to the log (line 104), containing information such as file name, transaction identifier, etc., and a "first" flag to show that this backout failure is the first for this file. If the transaction processing system finds that the "backout failed" status flag has already been set when it examines it at the occurrence of a backout failure (line 101), then it knows that a previous backout failure has occurred on this file, and it will not try to set the flag again or close the file, but will just write out a backout failed record to the system log containing the similar information to that before except that the flag will be set to "subsequent" rather than "first" (line 102).

When the file eventually closes (i.e. when all transactions accessing the file before the first backout failure have finished) (line 108), then the unwanted updates on the file have now become isolated because the system will not allow any attempt to open a file which has the "backout failed" flag set. At this point another type of backout failed log record is written (line 110) to signify that the backout failure process for this file is complete and that it is the responsibility of the batch backout utility 200 to backout updates to this file. The flag on this log record is set to "end" to signify this, and also extra information, which informs the batch backout utility of the filename to dataset name connections that it needs, is included on the log record.

The batch backout utility 200 reads the system log backwards searching for backout failure log records. A table is held within the batch backout utility, containing information from the previously processed backout failure log records. When the batch backout utility finds a backout failure log record it updates this table, depending on the type of backout failure log record read. The pseudocode of FIGS. 2A–2B shows an example of suitable batch backout utility logic.

The batch backout utility 200 need only read backwards through the system log and use the backout failed log records it sees to create and maintain an internal table which tells it exactly what it needs to know (i.e., which before-images to reinstate, whether to go ahead with a backout or to leave it to the emergency restart procedure, and also when it has finished all the backout processing that is needed).

The batch backout utility 200 will read the system log backwards looking for "backout failure" log records. When it finds one, it will check the dataset name in it, to see if it matches one that the user has specified as one which should be backed out. If so, then the batch backout utility will store the extra information in the "backout failure" log record and use this stored information to control which original records it should re-apply and when to stop processing.

As shown in FIGS. 2A–2B, in a further preferred embodiment of the invention the batch backout utility 200 only needs to be given the names of the datasets that the user wants to backout. It reads backwards through (a copy of) the system log (line 201) looking for an "end" type of backout failed record (line 205) containing a matching dataset name (line 203). If it finds one (line 205), then it stores the dataset name-to-filename connections from the record in its table (line 206). It will now also look for "subsequent" or "first" backout failed log records which contain the stored filenames (lines 210–216). It will add a transaction identifier from these records to its table (line 213) and use the stored filename-transaction identifier combinations to select the correct before-images to reinstate. It will also mark its table to remember if a "first" type record has been seen (lines 214–216), so that it will ignore any more backout failed log records for this file (because they would be from a set of backout failure records earlier in time but later in sequence since the batch backout utility is reading backwards through the system log) (lines 210–211).

The batch backout utility 200 also looks at the "start-of-task" flag in the records it reads. This flag shows the first record written for a transaction, and the batch backout utility will remove any matching transaction identifier from its table when it comes across the start of a transaction. In addition, if the table shows that a "first" backout failed log record has been seen for a file and the batch backout utility has just removed the last remaining transaction that had a backout failure on this file, then it can also remove this file entry since no more transaction entries will be made for this file. When there are no more file entries in the table, then the batch backout utility knows that it has backed-out all the uncommitted updates and it can stop.

As the batch backout utility 200 reads each before-image on the log (line 223), it will compare the filename and transaction identifier on the before-image with those stored in its table. If there is a table entry with a matching filename (line 224) and transaction identifier (line 225), then the batch backout utility knows that a backout failure must have occurred for this file and this transaction, and also that the file has been closed. It therefore knows that it should reinstate this before-image and backout an uncommitted update (line 226).

It will be appreciated that, although specific embodiments of the invention have been described herein for purposes of illustration, various modifications may be made without departing from the spirit and scope of the invention. Accordingly, the scope of protection of this invention is limited only by the following claims and their equivalents.

We claim:

1. In a method of removing uncommitted changes made to stored data by a computerized database management system, including the steps performed by the system of:

(a) storing a duplicate copy of data prior to effecting changes to the original copy;

(b) detecting a failure of the system or of a transaction or transactions effecting the changes; and (c) recovering from the failure using a backout process comprising attempting to replace the copy containing uncommitted changes by the duplicate copy, the improvement characterized by a method for recovering from a backout failure during the backout process comprising the further steps performed by the system of:

(d) detecting a failure of the system to replace during the backout process, the original copy containing uncommitted changes with the duplicate copy;

(e) preventing subsequent attempts by the system to further change the data until a copy containing the uncommitted changes has been removed by a process of backout failure processing, (f) writing a set of system log records to the log to bracket the duration of the backout failure for a particular file, said system log records tracking whether the system completed processing all transactions for the particular file, which transactions had failed backout, and which transaction was the first to have a backout failure, and (g) during the process of backout failure processing, reading through the log and replacing the original copy containing uncommitted changes with a duplicate copy as indicated by the set of system log records.

2. A method as claimed in claim 1 wherein the database management system is a transaction processing system.

3. A method as claimed in claim 1 wherein the system log records comprise backout failure log records, including the information that the process of backout failure processing will need to calculate if the backout failure processing can determine which original records to re-apply in order to backout uncommitted changes, where to start, where to stop, and which original records it must re-apply in order to backout uncommitted changes.

4. A method as claimed in claim 3 wherein fields in the backout failure log record include a flag set if one of the backout failure log records is the first backout failure log record for a given data set; a dataset name; and a transaction identifier.

5. A method as claimed in claim 3 wherein the backout failure log records comprise:
- a FIRST backout failure log record for indicating which task was the first to have a backout failure for a given dataset;
- a SUBSEQUENT backout failure log record for indicating which tasks had backout failures subsequently for a given dataset; and
- an END backout failure log record for indicating that backout failure has completed for a given dataset.

6. A method as claimed in claim 5 further comprising the steps performed by the system before step (d) of:
- (d1) detecting if this dataset has already had a backout failure;
- (d2) if step (d1) is true, writing a SUBSEQUENT backout failure log record;
- (d3) if step (d1) is not true, writing a FIRST backout failure log record, recording that the dataset has had a backout failure, and ensuring that subsequent attempts to update-the data base are disallowed; and
- (d4) When all tasks using the dataset have completed, closing the dataset and writing an END backout failure log record.

7. In a method of removing uncommitted changes made to stored data by a computerized database management system, including the steps performed by the system of:
- (a) storing a duplicate copy of data prior to effecting changes to the original copy;
- (b) detecting a failure of the system or of a transaction or transactions effecting the changes; and
- (c) recovering from the failure using a backout process comprising attempting to replace the copy containing uncommitted changes by the duplicate copy, the improvement characterized by a method for recovering from a backout failure during the backout process comprising the further steps performed by the system of:
- (d) using a set of backout failure log records to bracket the duration of the backout failure for a particular file, said backout failure log records tracking whether the system completed its backout failure processing, which transactions had failed backout, and which transaction was the first to have a backout failure, wherein the backout failure log records comprise:
  - a FIRST backout failure log record for indicating which task was the first to have a backout failure for a given dataset;
  - a SUBSEQUENT backout failure log record for indicating which tasks had backout failures subsequently for a given dataset; and
  - an END backout failure log record for indicating that backout failure has completed for a given dataset;
- (e) detecting a failure of the system to replace the copy containing uncommitted changes with the duplicate copy during the backout process;
- (f) detecting if the data set has already had a backout failure;
- (g) if step (f) is true, writing a SUBSEQUENT backout failure log record;
- (h) if step (f) is not true, writing a FIRST backout failure log record, recording that the dataset has had a backout failure, and ensuring that subsequent attempts to update the data base are disallowed;
- (i) when all tasks using the dataset have completed, closing the dataset and writing an END backout failure log record;
- (j) preventing subsequent attempts by the system to further change the data until the uncommitted changes have been removed by a process of backout failure processing; and
- (k) using a batch backout utility using the backout failure log records to calculate if it is safe to attempt backout, where to start, where to stop, and which original records it must re-apply in order to backout uncommitted changes.

* * * * *